(12) United States Patent  
Campbell et al.

(10) Patent No.: US 7,992,734 B2  
(45) Date of Patent: Aug. 9, 2011

(54) SEMICONDUCTOR AUTOMATION BUFFER STORAGE IDENTIFICATION SYSTEM AND METHOD

(75) Inventors: Philip L. Campbell, Millbrook, NY (US); Denise B. Joe, Stormville, NY (US); Edward Sherwood, Wingdale, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 11/972,685

(22) Filed: Jan. 11, 2008

(65) Prior Publication Data

US 2009/0178992 A1 Jul. 16, 2009

(51) Int. Cl.
B66C 19/00 (2006.01)
(52) U.S. Cl. .................. 212/331; 212/270; 414/940
(58) Field of Classification Search .................. 212/331, 212/270; 414/940
See application file for complete search history.

(56) References Cited

U.S. PATENT DOCUMENTS

| | | | |
|---|---|---|---|
| 4,805,759 A * | 2/1989 | Rochet et al. | 198/346.1 |
| 5,217,341 A * | 6/1993 | Webber et al. | 414/816 |
| 7,145,459 B2 | 12/2006 | Wu et al. | |
| 7,149,643 B2 | 12/2006 | Renken et al. | |
| 7,234,584 B2 * | 6/2007 | Rice et al. | 198/465.1 |
| 2004/0126208 A1 * | 7/2004 | Tawyer et al. | 414/222.02 |
| 2004/0265107 A1 * | 12/2004 | Kim et al. | 414/626 |
| 2006/0043197 A1 | 3/2006 | Chang et al. | |
| 2006/0067809 A1 * | 3/2006 | Ito | 414/274 |
| 2006/0237525 A1 * | 10/2006 | Sone | 235/375 |
| 2007/0046284 A1 | 3/2007 | Renken et al. | |
| 2007/0081879 A1 * | 4/2007 | Bonora et al. | 414/217 |
| 2007/0128007 A1 * | 6/2007 | Bonora et al. | 414/217 |
| 2008/0056864 A1 * | 3/2008 | Wada et al. | 414/331.01 |
| 2008/0106414 A1 * | 5/2008 | Ito | 340/572.1 |
| 2009/0276082 A1 * | 11/2009 | Murata | 700/226 |

* cited by examiner

*Primary Examiner* — Thomas J. Brahan
(74) *Attorney, Agent, or Firm* — Ian D. Mackinnon; Roberts Mlotkowski Safran & Cole, P.C.

(57) ABSTRACT

A system for reading substrate carriers that includes at least one overhead transport vehicle (OHT) utilizing at least one device for at least one of sensing and/or reading a substrate carrier, and/or wafers arranged therein, when the substrate carrier is proximate the at least one overhead transport vehicle. A method of sensing or reading a substrate carrier includes sensing and/or reading a substrate carrier and/or wafers arranged therein with the overhead transport vehicle.

18 Claims, 11 Drawing Sheets

«SEMICONDUCTOR AUTOMATION BUFFER STORAGE IDENTIFICATION SYSTEM AND METHOD

FIELD OF THE INVENTION

The invention generally relates to a system and method for reading substrate carriers, and/or wafers arranged therein, arranged in a buffer storage of a semiconductor manufacturing environment or facility using an overhead transport vehicle.

BACKGROUND OF THE INVENTION

Semiconductor manufacturing facilities typically utilize a number of buffer storage areas, a number of bays that includes processing tools, an overhead track system, and a number of overhead traveling vehicles or transporters (OHTs). The buffer storage areas store substrate carriers which are also known as front opening unified pods (FOUPs), standard mechanical interface (SMIF) pods, and cassettes.

It is also known to utilize overhead buffer storage systems (aka zero footprint storage) in semiconductor manufacturing facilities. These overhead storage systems are typically suspended from a ceiling in a manner similar to the track system. An OHT can access the overhead buffer storage system via the track and functions to transfer the substrate carriers between, among other locations, the processing tools and the overhead buffer storage system.

However, it sometimes occurs that the control system of the semiconductor manufacturing facility is rendered blind as to the specific location of each substrate carrier. This can occur when the data provided to the control system is lost or corrupted. When this occurs, the OHTs must go out to the areas where the substrate carriers are stored, retrieve each substrate carrier, and deliver it to a data collection area (i.e., one of the floor storage buffer locations or one of the processing tools). These data collection locations have RFID readers which can read the RFID tags of the substrate carriers.

This process is very time consuming and represents time that the facility is not processing wafers, which is, of course, very costly. For example, in a facility having 206 buffer storage locations in three different bays or in a facility having about 300 buffer storage locations in four different bays, one OHT can retrieve and transfer a substrate carrier to a read station in about 2 minutes. This means that the OHT will require 6.8 hours to identify all of the substrate carriers. If two OHTs are used, the OHTs will require 3.4 hours to identify all of the substrate carriers. If an entire fabrication facility with 5000 buffer locations needs to have the substrate carriers read, this can mean that all of the OHTs will be tied up in identifying the substrate carriers instead of delivering product to the processing tools, creating a potential bottleneck for the facility.

Accordingly, there exists a need in the art to overcome the deficiencies and limitations described herein.

SUMMARY OF THE INVENTION

In a first aspect of the invention, there is provided a system for sensing or reading substrate carriers comprising at least one overhead transport vehicle including at least one device for at least one of sensing a substrate carrier, reading a substrate carrier, and reading wafers arranged therein when the substrate carrier is proximate the at least one overhead transport vehicle.

In a second aspect of the invention, there is provided a system for reading substrate carriers, comprising at least one overhead transport vehicle mounted to an overhead track. The at least one overhead transport vehicle including at least one reader for reading a substrate carrier and/or wafers arranged therein when the substrate carrier is proximate the at least one overhead transport vehicle.

In a third aspect of the invention, there is provided a method of sensing or reading a substrate carrier with an overhead transport vehicle that includes sensing and/or reading a substrate carrier and/or wafers arranged therein with the overhead transport vehicle.

DETAILED DESCRIPTION OF EMBODIMENTS OF THE INVENTION

The invention generally relates to an overhead transport vehicle (OHT) which can be used in a semiconductor manufacturing environment or facility and which can read substrate carriers and/or wafers arranged therein. Substrate carriers are also known as front opening unified pods (FOUPs), standard mechanical interface (SMIF) pods, and cassettes. The invention also relates to a system and method for reading substrate carriers, and/or wafers arranged therein (e.g., in the case where a dummy wafer arranged in the FOUP includes an RFID tag), arranged in a buffer storage of a semiconductor manufacturing environment or facility using the OHT. The reading can preferably occur as the OHT passes the substrate carriers arranged in the overhead buffer storage system.

The invention offers a significant improvement over known systems of reading of the substrate carriers. For example, in an Annex East Phase having 206 buffer storage locations in three different bays, according to the invention, one OHT can read and/or identify all of the substrate carriers in a bay in about 3.5 minutes, and can read and/or identify all of the substrate carriers in about 10.5 minutes (excluding travel time between bays). If two OHTs are used, the OHTs can read and/or identify all of the substrate carriers in about 5.25 minutes (excluding travel time between bays).

The invention also relates to an OHT that is able to travel along an existing track system and carry a reader that can read the substrate carriers located within an overhead buffer storage system while the OHT is moving along the track. The invention thus addresses the time consuming problem of restoring the data to the facility control system thus reducing down time and increasing productivity of the facility.

The OHT can also be used on unified automation track systems, i.e., track systems that support an entire FAB in one continuous track, and is not limited to automation track systems that are not unified and have individual intra-bay tracks. Also, using an OHT having a reader will result in less downtime for the individual bays because it performs the reading of the substrate carriers while the OHT is transferring the substrate carriers, e.g., between the processing tools and/or between the buffer storage and the processing tools.

Figure 1:
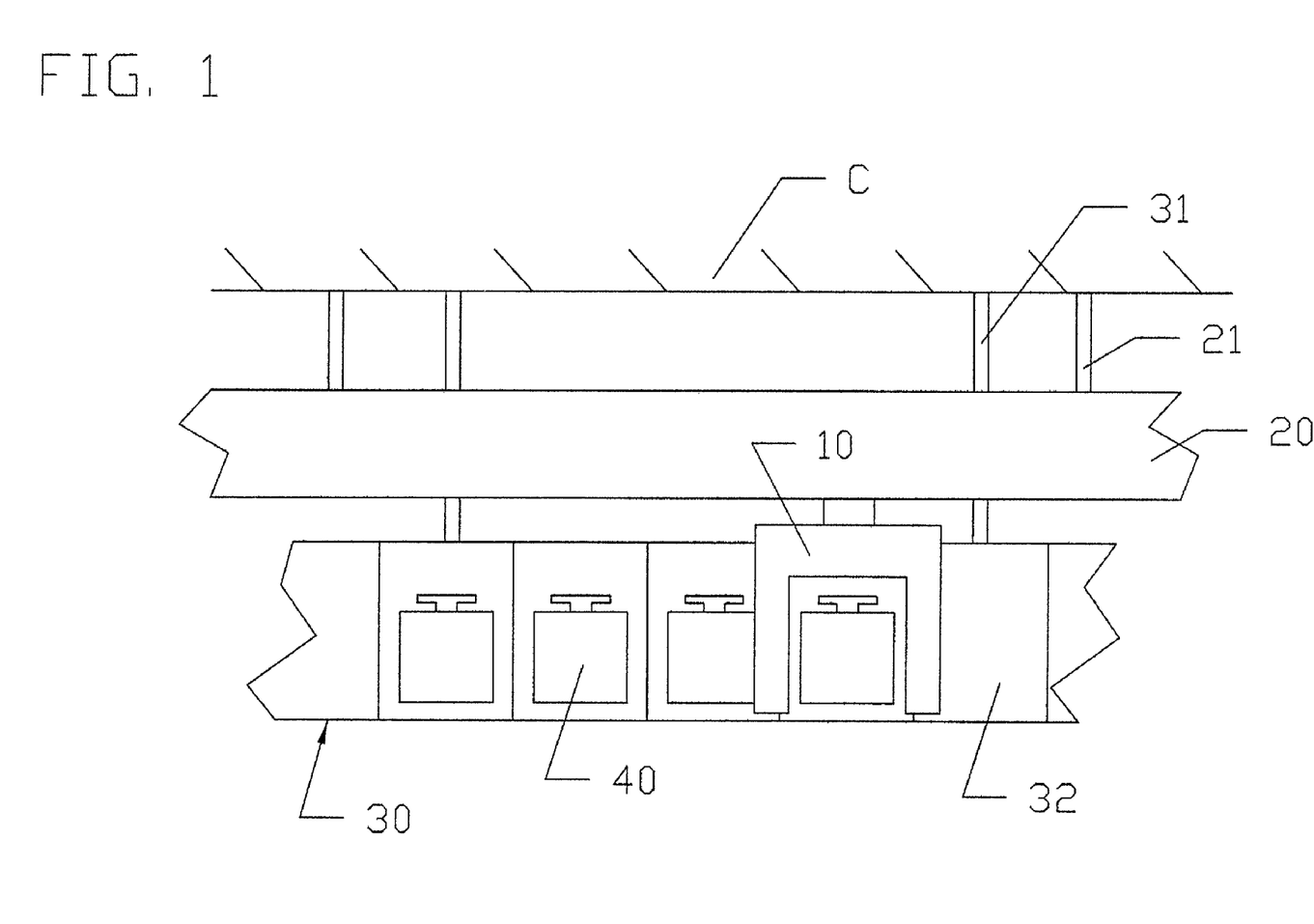
FIG. 1 shows a side view of an overhead track and an overhead buffer storage system suspended from a ceiling, and with an overhead transport vehicle mounted to the track.

With reference to FIG. 1, there is shown a conventional system which utilizes an overhead buffer storage system 30 (aka zero footprint storage) in a semiconductor manufacturing facility. The overhead storage system 30 has a number of storage areas 32 which can store substrate carriers 40. The overhead storage system 30 is suspended from a ceiling C via supports 31. A track system 20 is also suspended from the ceiling C via supports 21. An OHT 10 accesses the overhead buffer storage system 30 via the track 20 and functions to move or transfer the substrate carriers 40 between, among other locations, the processing tools and the overhead buffer storage system 30.

Figure 2:
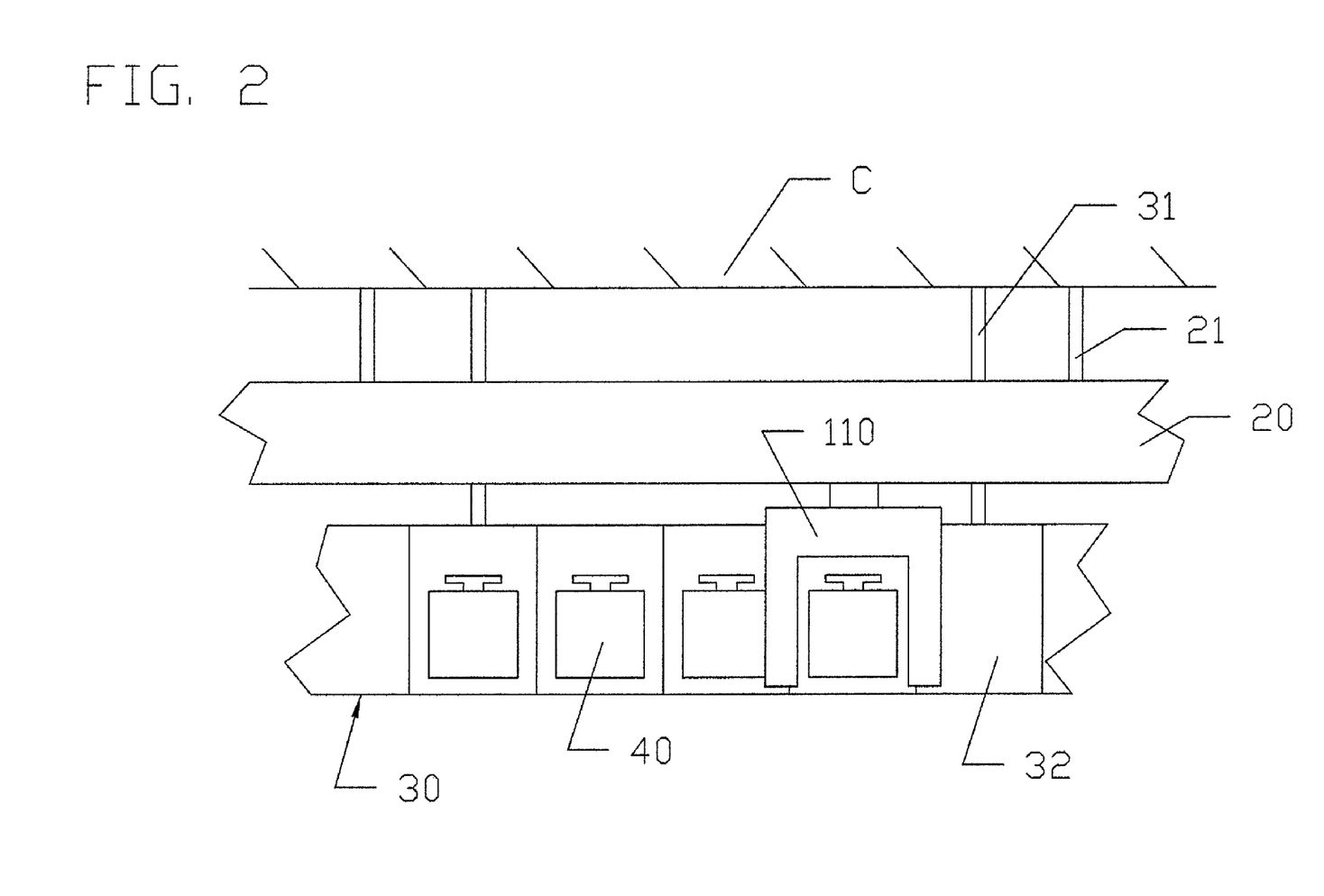
FIG. 2 shows a side view of an overhead track and an overhead buffer storage system suspended from a ceiling, and with an overhead transport vehicle mounted to the track in accordance with the invention.
Figure 3:
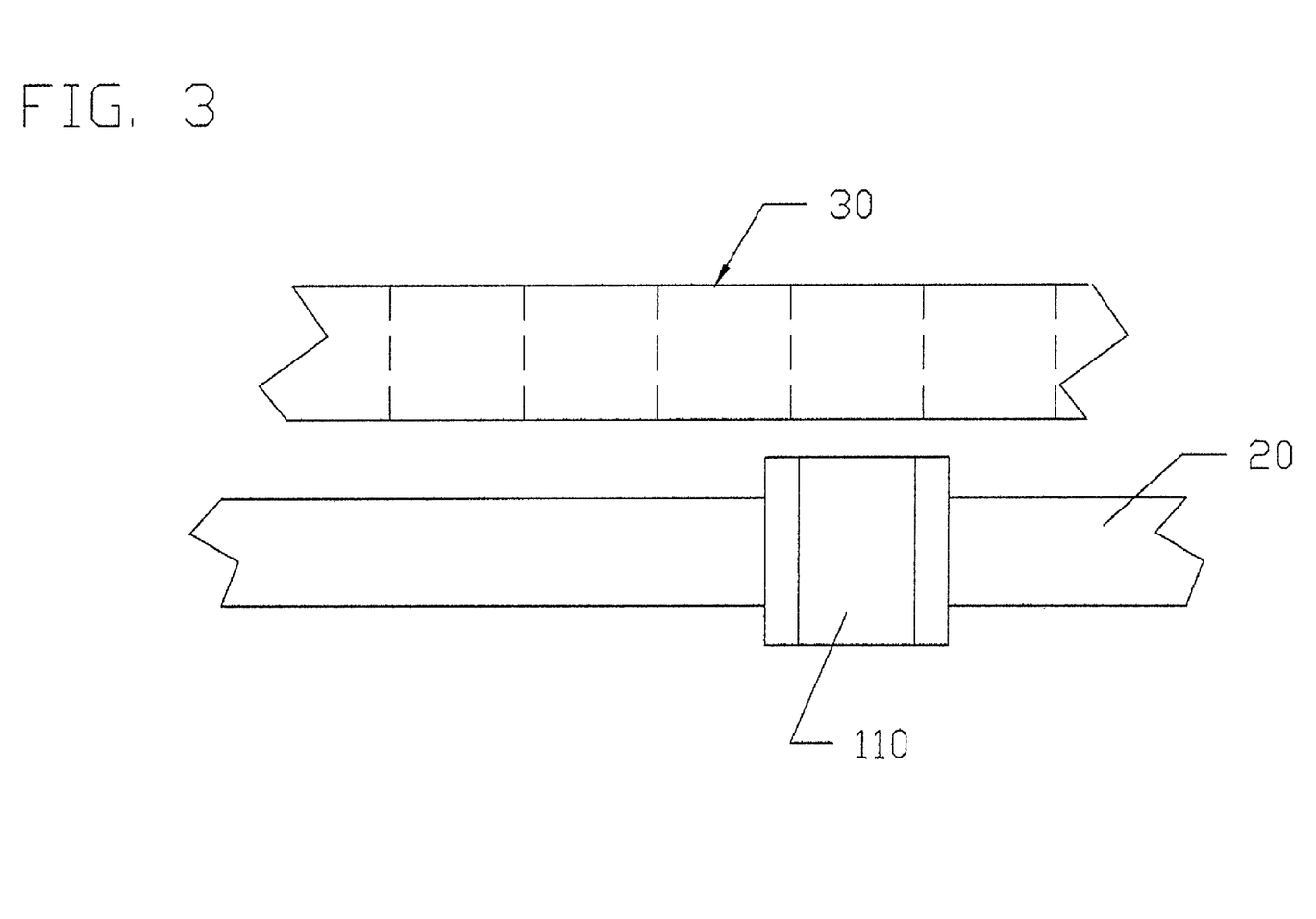
FIG. 3 shows a bottom view of FIG. 2 in accordance with the invention.
Figure 4:
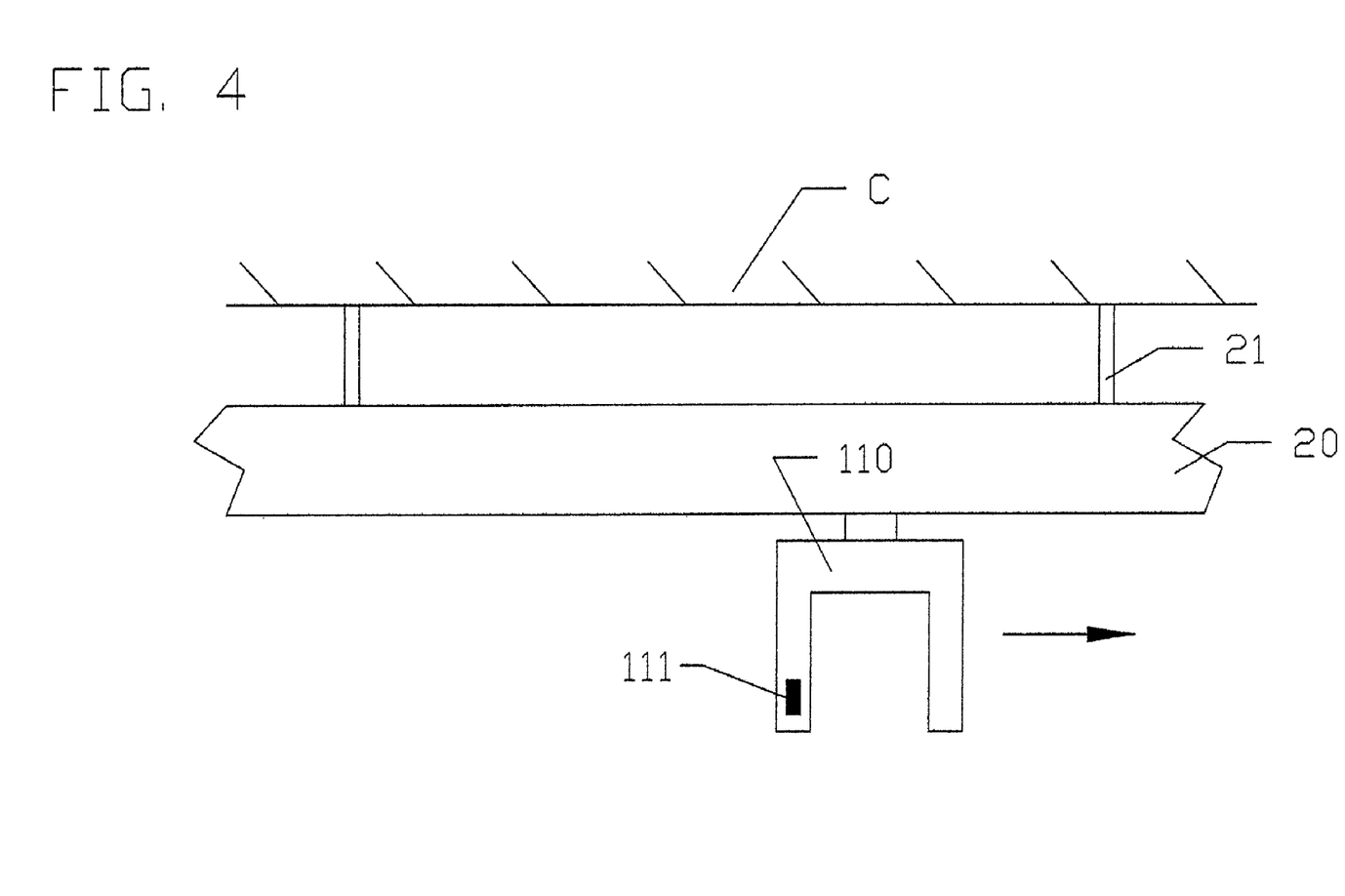
FIG. 4 shows an opposite side view to that of FIG. 2 with the overhead buffer storage system removed in accordance with the invention.

With reference to FIGS. 2-4, there is shown one embodiment of the invention. In FIG. 2, an overhead buffer storage system 30 (aka zero footprint storage) in semiconductor manufacturing facility has a number of storage areas 32 which can store substrate carriers 40 and is suspended from a ceiling C via supports 31. A track system 20 is also suspended from the ceiling C via supports 21 and is arranged on one side of the overhead storage system 30 (FIG. 3). An OHT 110 according to the invention accesses the overhead buffer storage system 30 via the track 20 and functions to move or transfer the substrate carriers 10 between, among other locations, the processing tools and the overhead buffer storage system 30.

With reference to FIG. 4, the OHT 110 includes a reader 111 which can read the substrate carrier and/or wafers arranged therein. The reader 111 can be integrally mounted to a side surface of the OHT 110 and can be a RFID reader or a barcode reader. Preferably, the reader 111 is an RFID reader which is structured and arranged to read an RFID tag that is mounted to the substrate carrier.

Figure 5:
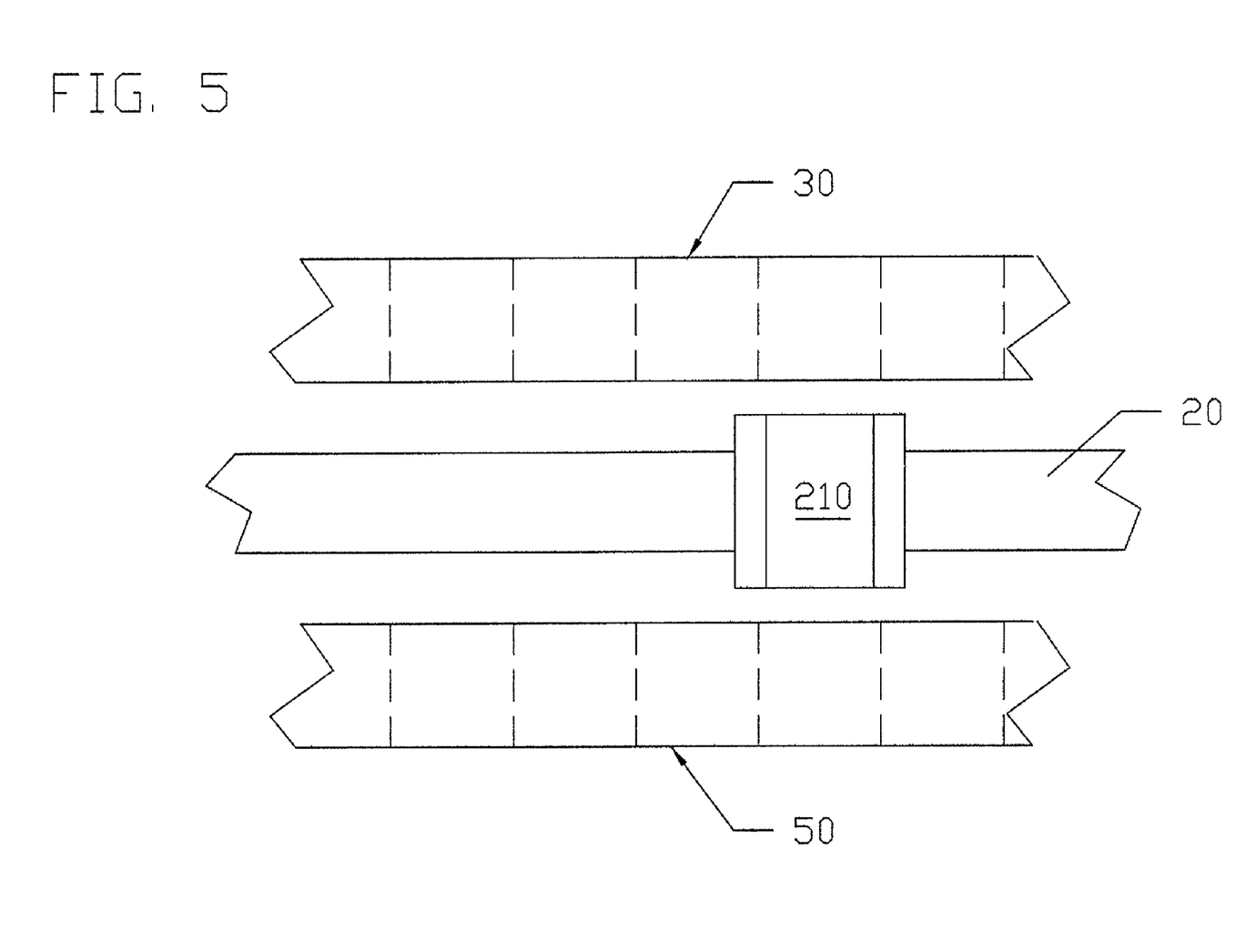
FIG. 5 shows a bottom view of another embodiment of an overhead track and two overhead buffer storage systems suspended from a ceiling, and with an overhead transport vehicle mounted to the track in accordance with the invention.
Figure 6:
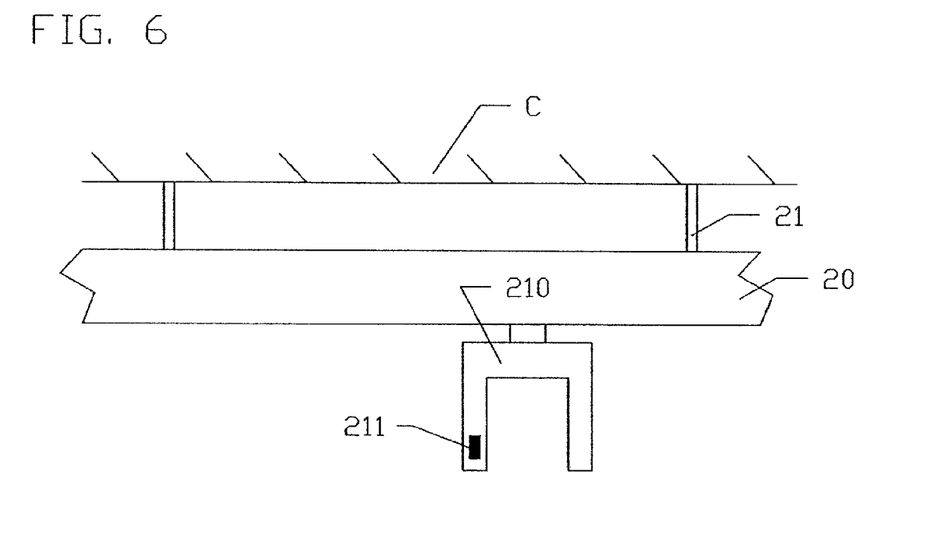
FIG. 6 shows one side view of the embodiment shown in FIG. 5 with the overhead buffer storage systems removed in accordance with the invention.
Figure 7:
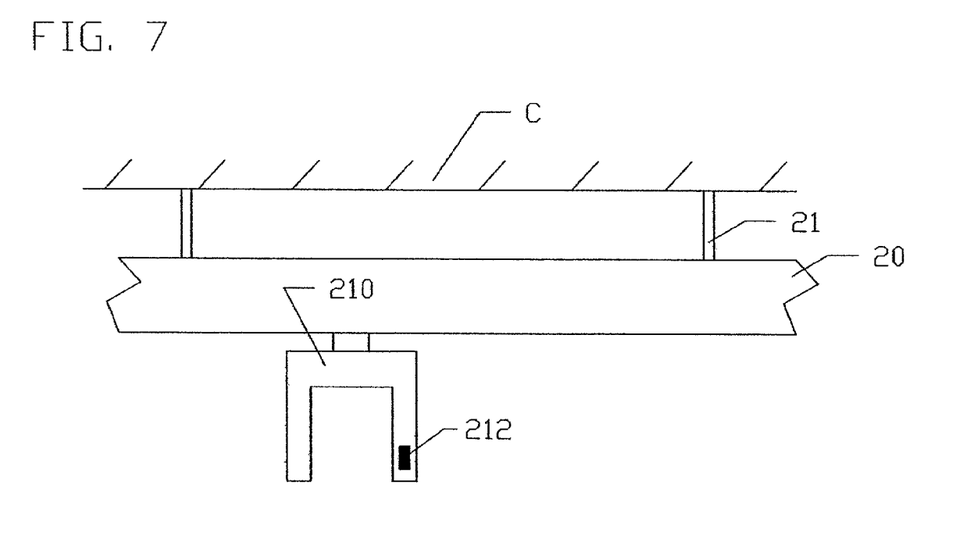
FIG. 7 shows an opposite side view of FIG. 6 with the overhead buffer storage systems removed in accordance with the invention.

With reference to FIGS. 5-7, there is shown another embodiment of the invention. In FIG. 5, two overhead buffer storage systems 30 and 50 (aka zero footprint storage) in a semiconductor manufacturing facility have a number of storage areas which can store substrate carriers and which are suspended from a ceiling via supports. A track system 20 is also suspended from the ceiling C via supports 21 (see FIGS. 6 and 7). An OHT 210 according to the invention accesses the overhead buffer storage systems 30 and 50 via the track 20 and functions to move or transfer the substrate carriers between, among other locations, the processing tools and the overhead buffer storage systems 30 and 50.

With reference to FIGS. 6 and 7, the OHT 210 includes two opposite facing and/or oppositely arranged readers 211 and 212 which can read the substrate carriers of the two storage systems arranged on opposite sides of the OHT 210 (FIG. 5). The readers 211 and 212 can be integrally mounted to side surfaces of the OHT 210 and can each be a RFID reader or a barcode reader. Preferably, the readers 211 and 212 are RFID readers which are structured and arranged to read an RFID tag that is mounted to each substrate carrier.

Figure 8:
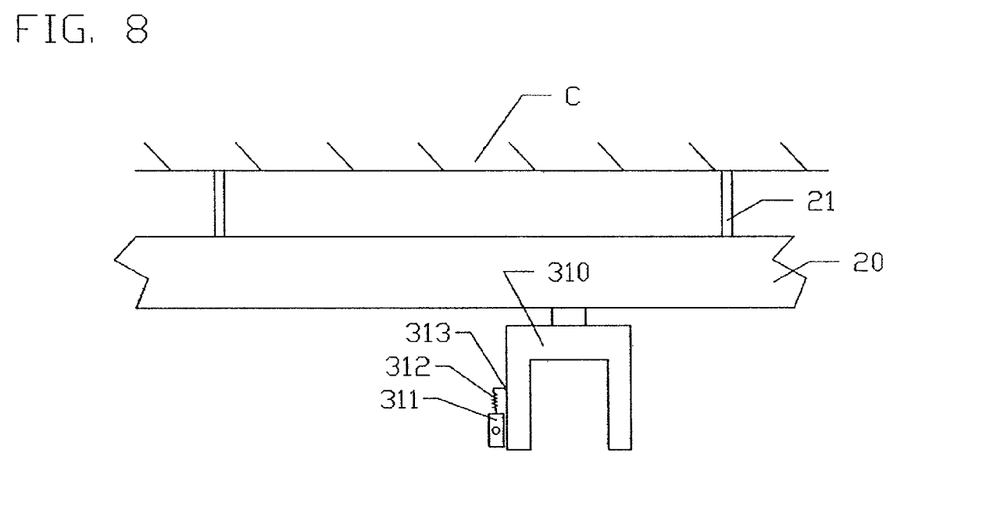
FIG. 8 shows a side view of another embodiment of an overhead transport vehicle mounted to the track in accordance with the invention.

With reference to FIG. 8, there is shown another embodiment of the invention. In FIG. 8, a track system 20 is suspended from the ceiling C via supports 21. An OHT 310 according to the invention accesses an overhead buffer storage system (not shown) via the track 20 and functions to move or transfer the substrate carriers between, among other locations, the processing tools and the overhead buffer storage systems. The OHT 310 includes a removably mounted reader 311 which can read the substrate carriers. The reader 311 has an electrical cable 312 whose free end has a connector 313 which can be connected to a surface of the OHT 310. Preferably, the reader 311 is an RFID reader which is structured and arranged to read an RFID tag that is mounted to each substrate carrier.

Figure 9:
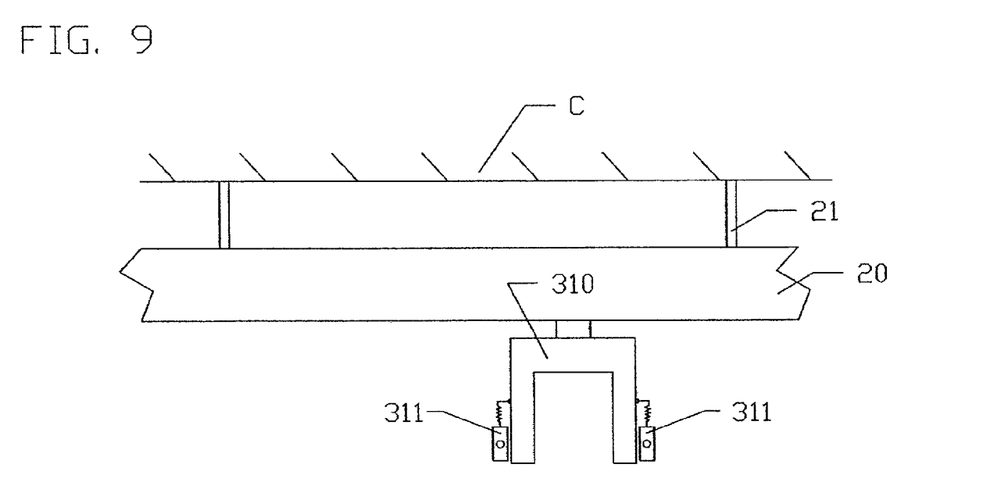
FIG. 9 shows a side view of another embodiment of an overhead transport vehicle mounted to the track in accordance with the invention.

With reference to FIG. 9, there is shown another embodiment of the invention. As in the embodiment shown in FIG. 8, a track system 20 is suspended from the ceiling C via supports 21. An OHT 310 according to the invention accesses two overhead buffer storage systems (not shown) via the track 20 and functions to move or transfer the substrate carriers between, among other locations, the processing tools and the overhead buffer storage systems. The OHT 310 includes two removably mounted readers 311 which can read the substrate carriers arranged on opposite sides of the OHT 310. The readers 311 each have an electrical cable whose free end has a connector which can be connected to surfaces of the OHT 310. Preferably, the readers 311 are RFID readers which is structured and arranged to read an RFID tag that is mounted to each substrate carrier.

Figure 10:
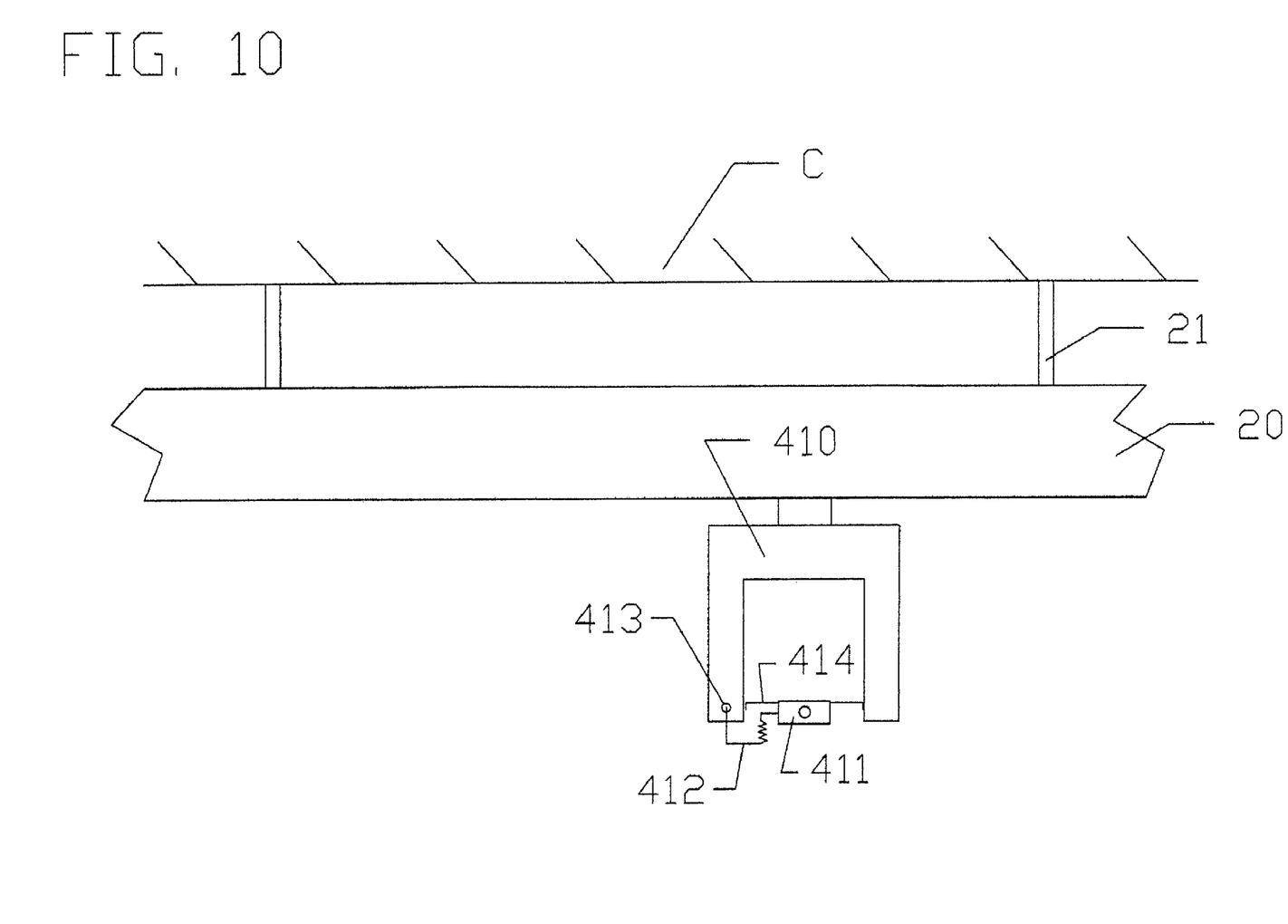
FIG. 10 shows a side view of another embodiment of an overhead transport vehicle mounted to the track in accordance with the invention.

With reference to FIG. 10, there is shown another embodiment of the invention. As in the previous embodiments, a track system 20 is suspended from the ceiling C via supports 21. An OHT 410 according to the invention accesses an overhead buffer storage system (not shown) via the track 20 and functions to move or transfer the substrate carriers between, among other locations, the processing tools and the overhead buffer storage systems. The OHT 410 includes a reader 411 which is mounted via a bracket system 414 within the OHT 410 and in a position which allows the OHT 410 to receive therein the substrate carrier above the reader 411 when the substrate carrier is picked-up by the OHT 410. The reader 411 can read the substrate carriers as in the previous embodiments. The reader 411 has an electrical cable 412 whose free end has a connector 413 which can be connected to a surface of the OHT 410. Preferably, the reader 411 is an RFID reader which is structured and arranged to read an RFID tag that is mounted to each substrate carrier.

Figure 11:
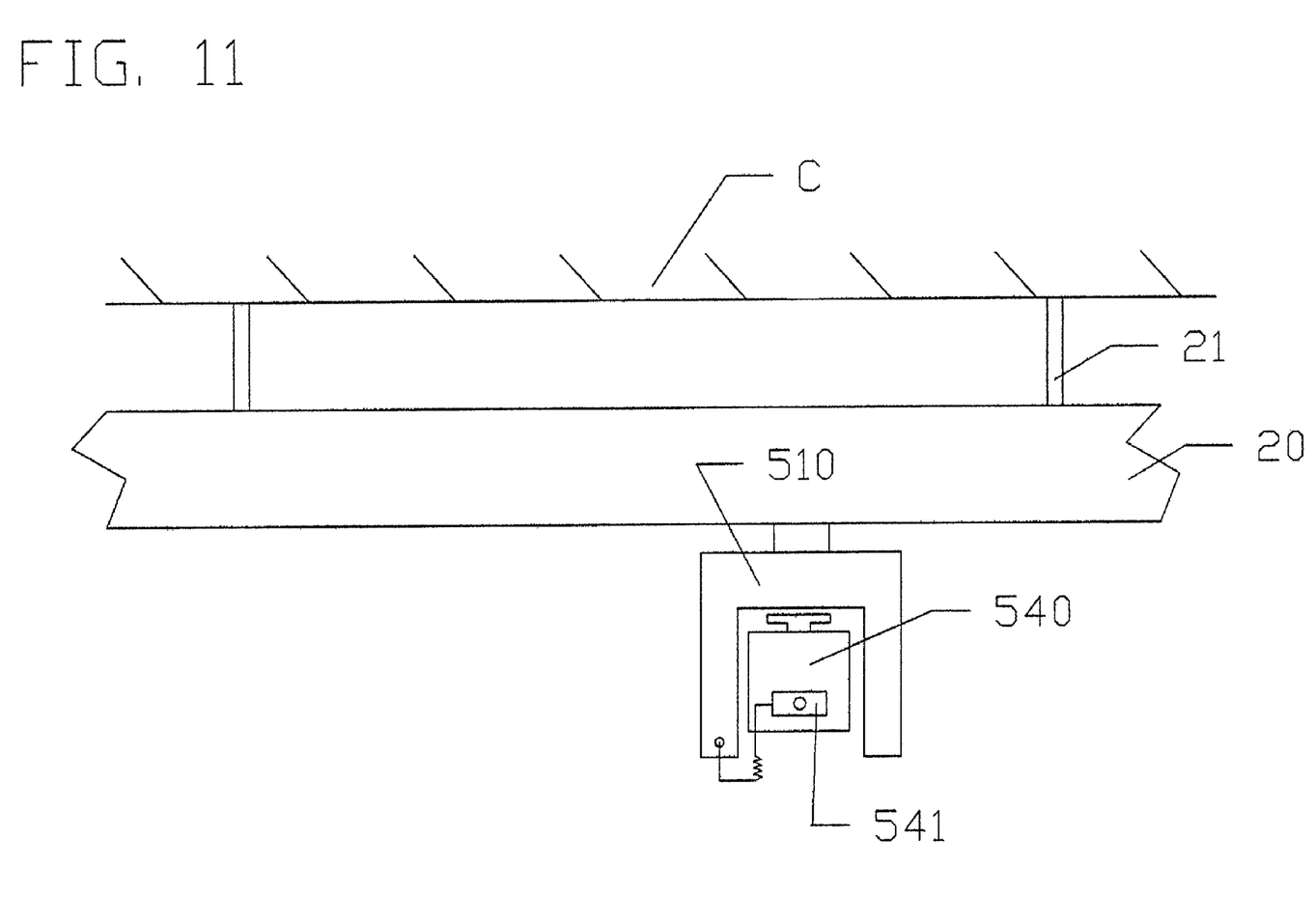
FIG. 11 shows a side view of another embodiment of an overhead transport vehicle within which is arranged a dummy substrate carrier which incorporates a substrate carrier reader in accordance with the invention.

With reference to FIG. 11, there is shown another embodiment of the invention. As in the previous embodiments, a track system 20 is suspended from the ceiling C via supports 21. An OHT 510 according to the invention accesses an overhead buffer storage system (not shown) via the track 20 and functions to move or transfer the substrate carriers between, among other locations, the processing tools and the overhead buffer storage systems. When it is desired to use the OHT 510 to read substrate carriers, the OHT 510 can move to a position and pick-up a dummy substrate carrier 540 whose only function is to support a reader 541. The reader 541 can read the substrate carriers as in the previous embodiments. The reader 541 has an electrical cable whose free end has a connector which can be connected to a surface of the OHT 510. Preferably, the reader 541 is an RFID reader which is structured and arranged to read an RFID tag that is mounted to each substrate carrier. The substrate carrier can be, e.g., a FOUP or SMIF type carrier. Since these types of substrate carriers have different shapes and/or configurations, the OHT 510 is preferably of the type which can transfer either or both types of substrate carriers in a manner which allows the substrate carriers to be read.

Figure 12:
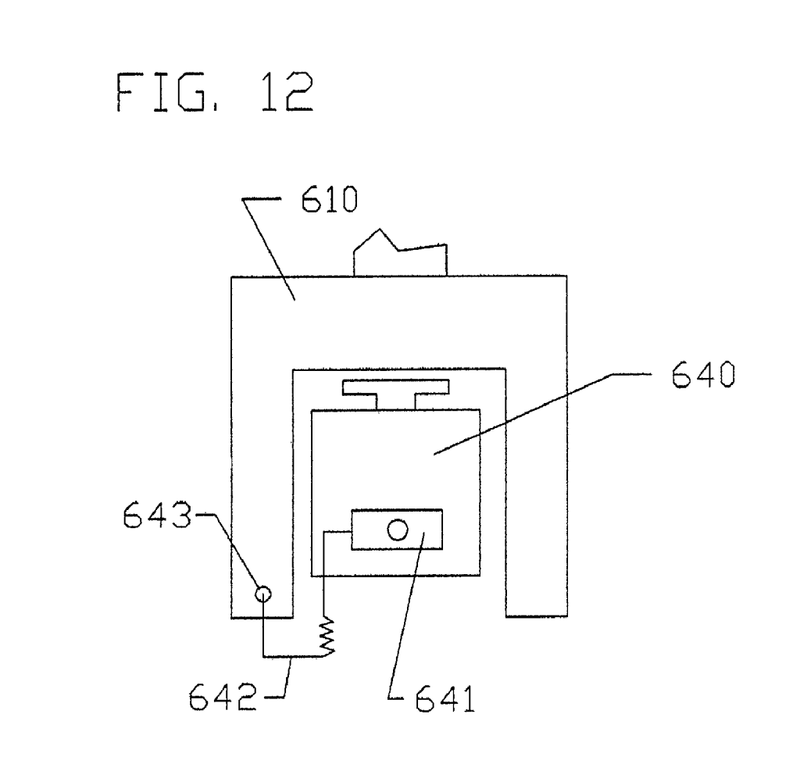
FIGS. 12 and 13 show opposite side views of another embodiment of an overhead transport vehicle within which is arranged a dummy substrate carrier which incorporates two opposite facing substrate carrier readers in accordance with the invention.
Figure 13:
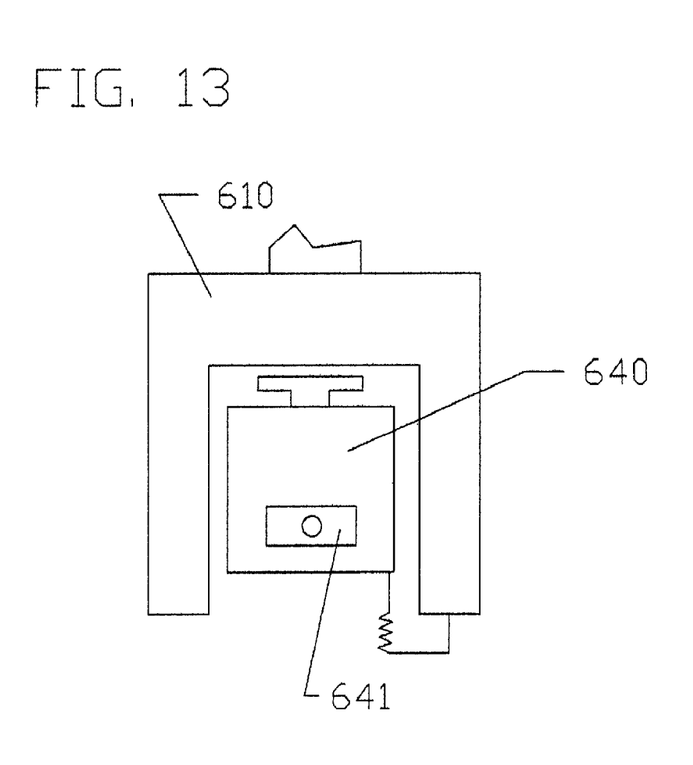

With reference to FIGS. 12 and 13, there is shown another embodiment of the invention. An OHT 610 according to the invention accesses an overhead buffer storage system (not shown) via a track (not shown) and functions to move or transfer the substrate carriers between, among other locations, the processing tools and the overhead buffer storage systems. When it is desired to user the OHT 610 to read substrate carriers, the OHT 610 can move to a position and pick-up a dummy substrate carrier 640 whose only function is to support two oppositely arranged readers 641 which can read substrate carriers arranged on oppositely arranged storage buffers of the type shown in FIG. 5. The readers 641 can read the substrate carriers as in the previous embodiments. The readers 641 have an electrical cable 642 whose free end has a connector 643 which can be connected to a surface of the OHT 610. Preferably, the readers 641 are RFID readers which are structured and arranged to read an RFID tag that is mounted to each substrate carrier. The substrate carrier can be, e.g., a FOUP or SMIF type carrier. Since these types of substrate carriers have different shapes and/or configurations, the OHT 610 is preferably of the type which can transfer either or both types of substrate carriers in a manner which allows the substrate carriers to be read.

Figure 14:
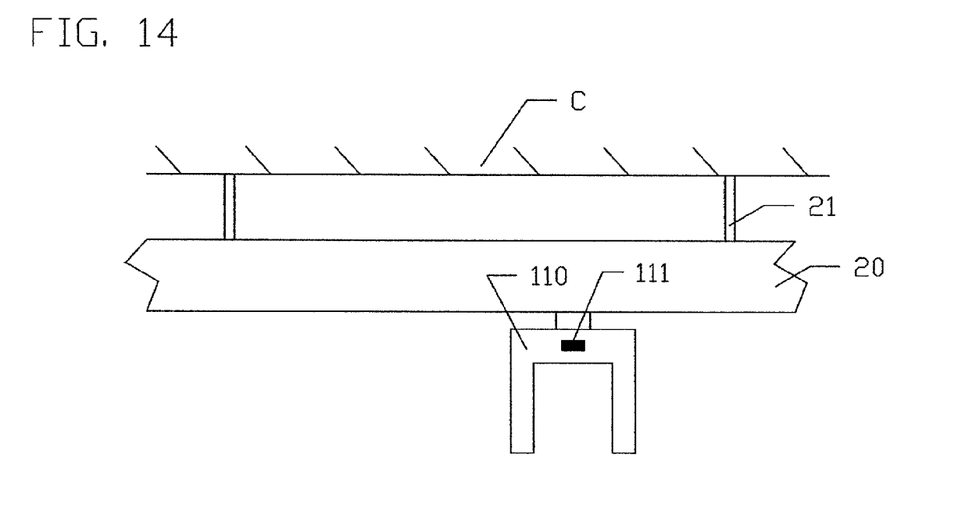
FIGS. 14 and 15 show side views of other embodiments of an overhead transport vehicle mounted to the track in accordance with the invention.

FIG. 14 shows a side view of another embodiment of an overhead transport vehicle mounted to the track in accordance with the invention. As with previous embodiment shown in FIG. 4, the OHT 110 is mounted to a track 20 supported via the ceiling C via supports 21. The OHT 110 includes a reader 111 which can read a SMIF type substrate carrier. The reader 111 can be integrally mounted to an upper portion of the OHT 110 and can be a RFID reader or a barcode reader. Preferably, the reader 111 is an RFID reader which is structured and arranged to read an RFID tag that is mounted to and/or arranged on the SMIF type substrate carrier.

Figure 15:
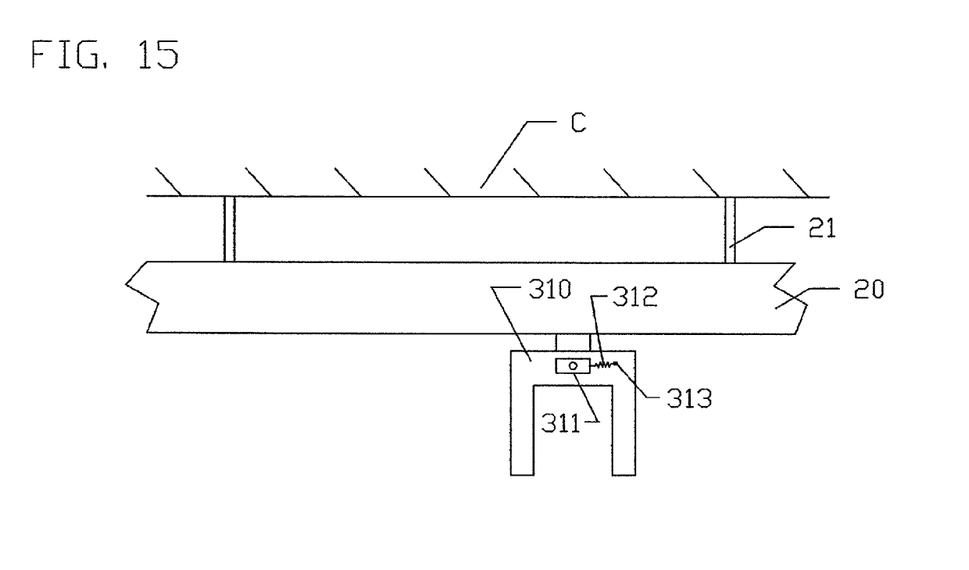

FIG. 15 shows a side view of another embodiment of an overhead transport vehicle mounted to the track in accordance with the invention. As with previous embodiment shown in FIG. 8, the OHT 310 is mounted to a track 20 supported via the ceiling C via supports 21. The OHT 310 includes a reader 311 which can read a SMIF type substrate carrier. The reader 311 can be mounted to an upper portion of the OHT 310, is connected thereto via an electrical conduit 312 and a connector 313, and can be a RFID reader or a barcode reader. Preferably, the reader 311 is an RFID reader which is structured and arranged to read an RFID tag that is mounted to and/or arranged on the SMIF type substrate carrier.

The invention also provides for a method of reading a substrate carrier with an OHT of the type described herein, wherein the method includes reading a substrate carrier with the OHT. The OHT can move on an overhead track and the OHT can also move and read simultaneously so that a number of substrate carriers can be read while the OHT moves along the track.

The method and apparatus as described above can be used in a facility which is used for the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be recognized that RFID technology uses electromagnetic energy (such as radio) as a medium through which information is sent. An RFID tag is arranged on a substrate carrier and is used for transmitting and/or receiving radio frequency signals. The reader receives radio frequency signals from the RFID tag and transmits radio frequency signals to the RFID tag. The reader of the invention can be connected to a computer via a communications link which passes from the OHT to the track. The communications link may be any one of various types of well-known communication links such as a cable line that directly connects the reader to the computer, such as, e.g., an Ethernet communications link, or a modem communications link. Through the communications link, the reader can receive information from the RFID tag and send it to the computer.

The RFID tag typically includes a receiver and some type of transmitter, an antenna, and memory. There are two categories of RFID tags, i.e., active and passive, that represents two different types of RF communication. Tags without batteries are known as passive tags because they derive their power from the RF energy transmitted from a reader. Passive RFID tags tend to be smaller and exhibit short range transmission characteristics (under six feet), whereas battery-powered, active tags, tend to be larger and exhibit long range transmission characteristics (over one hundred feet). Active tags send data back to the reader with radio power generated from a battery within the tag. Passive tags, on the other hand, use modulated backscatter (MBS) to transmit reflected energy, dictated by the data stream from the tag, back to the reader. Both types of tags can be used in the invention.

With the aid of RFID technology, substrate carriers and/or the wafers arranged therein which are brought within range of a reader, or interrogator, may be detected and read. Furthermore, the substrate carriers and/or the wafers arranged therein can be identified and their progress tracked using this technology.

While the invention has been described in terms of embodiments, those skilled in the art will recognize that the invention can be practiced with modifications and in the spirit and scope of the appended claims.

What is claimed:

1. A system for sensing or reading substrate carriers comprising:
   at least one overhead transport vehicle (OHT), mounted to an overhead track and structured and arranged for movement along the overhead track; and
   at least one overhead buffer storage system arranged adjacent the overhead track,
   wherein the OHT includes at least one device for:
      sensing a substrate carrier positioned in the at least one overhead buffer storage system while moving along the overhead track;
      reading a substrate carrier positioned in the at least one overhead buffer storage system while moving along the overhead track; and
      reading wafers arranged in a substrate carrier positioned in the at least one overhead buffer storage system when the substrate carrier is proximate the at least one OHT while moving along the overhead track.

2. The system of claim 1, wherein the at least one OHT comprises a mechanism for picking-up the substrate carrier.

3. The system of claim 1, wherein the at least one OHT is structured and arranged to transfer the substrate carrier between a storage location and a processing tool.

4. The system of claim 1, wherein the at least one device comprises a RFID reader.

5. The system of claim 1, wherein the at least one device comprises a barcode reader.

6. The system of claim 1, wherein the substrate carrier comprises one of an RFID tag and a barcode.

7. The system of claim 1, wherein the at least one device is integrally connected to a portion of the OHT.

8. The system of claim 1, wherein the at least one device is removably connected to a portion of the OHT.

9. The system of claim 1, wherein the at least one device is arranged on a dummy substrate carrier arranged in the OHT.

10. The system of claim 1, wherein the at least one device is arranged on a removable dummy substrate carrier arranged in the OHT.

11. The system of claim 1, further comprising two overhead buffer storage systems arranged adjacent the overhead track, wherein the at least one OHT is movably mounted to the overhead track between the two overhead buffer storage systems.

12. The system of claim 1, wherein the at least one OHT is structured and arranged to pick-up and remove the substrate carrier from the at least one overhead buffer storage system.

13. A system for reading substrate carriers, comprising:
   at least one overhead transport vehicle (OHT) mounted to an overhead track; and
   at least one overhead buffer storage system arranged adjacent the overhead track,
   wherein the at least one OHT includes at least one reader for (i) reading a substrate carrier when the substrate carrier is moving and proximate the at least one OHT, (ii) reading wafers arranged in the substrate carrier positioned in the at least one overhead buffer storage system when the substrate carrier is proximate the at least one OHT, and (iii) sensing the substrate carrier positioned in the at least one overhead buffer storage system while the OHT is moving along the overhead track.

14. The system of claim 13, wherein the at least one OHT comprises a mechanism for picking-up the substrate carrier.

15. The system of claim 13, wherein the at least one device for reading a substrate carrier comprises a RFID reader and the substrate carrier comprises an RFID tag.

16. The system of claim 13, wherein the at least one reader is at least one of:
   integrally connected to a portion of the OHT;
   removably connected to a portion of the OHT;
   arranged on a dummy substrate carrier arranged in the OHT; and
   arranged on a removable dummy substrate carrier arranged in the OHT.

17. A method of sensing or reading a substrate carrier with an overhead transport vehicle (OHT) mounted to an overhead track and structured and arranged for movement along the overhead track, the method comprising:
   sensing a substrate carrier positioned in at least one overhead buffer storage system with the OHT while moving along the overhead track;
   reading a substrate carrier positioned in the at least one overhead buffer storage system with the OHT while moving along the overhead track; and
   reading wafers arranged within a substrate carrier positioned in the at least one overhead buffer storage system with the OHT while moving along the overhead track.

18. The method of claim 17, further comprising at least one of:
   moving the OHT on the overhead track; and
   moving the OHT on the overhead track during the reading.

* * * * *